United States Patent
Yamashita et al.

(10) Patent No.: US 7,182,241 B2
(45) Date of Patent: Feb. 27, 2007

(54) MULTI-FUNCTIONAL SOLDER AND ARTICLES MADE THEREWITH, SUCH AS MICROELECTRONIC COMPONENTS

(75) Inventors: Tsuyoshi Yamashita, Wilmington, NC (US); Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 404 days.

(21) Appl. No.: 10/215,732

(22) Filed: Aug. 9, 2002

(65) Prior Publication Data

US 2004/0026484 A1    Feb. 12, 2004

(51) Int. Cl.
B23K 1/20 (2006.01)
B23K 31/02 (2006.01)
B23K 35/34 (2006.01)

(52) U.S. Cl. .................. 228/223; 228/180.21; 228/224; 148/23

(58) Field of Classification Search ........... 228/180.22, 228/180.21, 223, 224; 148/22–24
See application file for complete search history.

(56) References Cited

U.S. PATENT DOCUMENTS

| | | | |
|---|---|---|---|
| 4,180,616 A | | 12/1979 | Lovering et al. |
| RE30,696 E | | 8/1981 | Arbib et al. |
| 4,345,814 A | | 8/1982 | Gutbier et al. |
| 5,059,272 A | * | 10/1991 | Kono et al. ............... 156/306.6 |
| 5,118,029 A | | 6/1992 | Fuse et al. |
| 5,229,070 A | | 7/1993 | Melton et al. |
| 5,405,577 A | | 4/1995 | Seelig et al. |
| 5,417,771 A | | 5/1995 | Arita et al. |
| 5,907,007 A | * | 5/1999 | Ito et al. ..................... 524/239 |
| 6,142,363 A | | 11/2000 | Tanahashi et al. |
| 6,214,131 B1 | | 4/2001 | Hua |
| 6,367,150 B1 | * | 4/2002 | Kirsten ......................... 29/840 |
| 6,402,013 B2 | * | 6/2002 | Abe et al. ................... 228/223 |
| 6,566,234 B1 | * | 5/2003 | Capote et al. ............... 438/458 |
| 6,580,169 B2 | | 6/2003 | Sakuyama et al. |
| 6,610,430 B1 | | 8/2003 | Thompson, Sr. |
| 6,641,679 B2 | * | 11/2003 | Nishina et al. ............... 148/24 |
| 6,644,536 B2 | | 11/2003 | Ratificar et al. |
| 2002/0046627 A1 | | 4/2002 | Amita et al. |
| 2002/0195170 A1 | | 12/2002 | Nomura et al. |
| 2004/0250919 A1 | | 12/2004 | Saito et al. |
| 2005/0028887 A1 | | 2/2005 | Yamashita et al. |

(Continued)

OTHER PUBLICATIONS

Bauer, B. and Lathrop R., "An Introduction to Solder Materials," pp. 1-9, *Surface Mount Technology*, Mar. 1998, PennWell Corporation, Nashua, New Hampshire.

(Continued)

*Primary Examiner*—Lynne R. Edmondson
(74) *Attorney, Agent, or Firm*—Perkins Coie LLP

(57) ABSTRACT

Aspects of the invention provide solder compositions which include two different fluxing agents. One of the fluxing agents promotes melting of a metal of the solder at a first activation temperature and the other fluxing agent promotes melting of the metal at a second activation temperature that is higher than the first activation temperature. This dual-flux solder may be used in manufacturing microelectronic components and microelectronic component assemblies. In one specific application, the solder may be used to manufacture a flip chip or other microelectronic component which includes self-fluxing solder balls. This can obviate the need to apply another flux composition to the solder balls prior to a subsequent component attach reflow operation.

25 Claims, 4 Drawing Sheets

U.S. PATENT DOCUMENTS

2005/0029334 A1 2/2005 Yamashita et al.
2005/0029667 A1 2/2005 Yamashita et al.

OTHER PUBLICATIONS

Cookson Electronics, Cookson Semiconductor Packaging Materials, Technical Bulletin APPL06, "Bumping BGA Packages, Solder Sphere/Paste Reflow," http://www.cooksonsemi.com/pdfs/Bumping%20BGA%20Pkgs_2002.pdf, 3 pages, Mar. 2000.

Coyle, R.J. et al., "Solder Joint Attachment Reliability and Assembly Quality of a Molded Ball Grid Array Socket," 2001 Electronic Components and Technology Conference, 8 pages, IEEE, Inc., Los Alamitos, California, 2001.

Surface Mount Equipment Manufacturers Association, "Reflow Terms and Definitions 4.0," http://www.ipc.org/html/smema4.pdf, 3 pages, IPC SMEMA Council, Copyright 2001.

Von Hessen, W.P., "Flip Chip—Integrated In A Standard SMT Process," http://www.uic.com/wcms/images.nsf/(graphiclib)/mc-2512+integrated+in+a+standard+smt+process.pdf/$file/mc-2512+integrated+in+a+standard+smt+process.pdf (accessed May 27, 2002), pp. 1-7, Universal Instruments Corporation.

Xilinx, Inc., "Xilinx Packaging and Thermal Characteristics: Reflow Soldering Process Guidelines," http://www.xilinx.com/publications/products/packaging/reflow.htm (accessed May 27, 2002), 3 pages.

* cited by examiner

MULTI-FUNCTIONAL SOLDER AND ARTICLES MADE THEREWITH, SUCH AS MICROELECTRONIC COMPONENTS

TECHNICAL FIELD

The present invention provides certain improvements in processing microelectronic workpieces. The invention has particular utility in connection with microelectronic component processing, e.g., in manufacturing microelectronic devices including solder connections.

BACKGROUND

Different components of a microelectronic component assembly can be attached and electrically coupled to each other in a variety of ways. For example, flip chips typically include a series of bond pads, each of which carries a separate solder ball or "bump." This "bumped" chip may then be positioned on a substrate with the solder balls contacting an array of electrical contacts carried on a surface of the substrate. By heating the solder, the flip chip can be mechanically joined and electrically coupled to the substrate.

FIG. 1 schematically outlines a conventional process for "bumping" a flip chip and attaching the flip chip to a substrate. This process 10 starts with a chip bearing a plurality of bond pads in step 12. Solder is deposited on the bond pads in step 14. This may be accomplished, for example, by depositing a solder paste through a solder stencil or by attaching pre-formed solder spheres on the bond pads. Solder pastes commonly include a soldering flux which reacts with metal oxides in the solder paste, which can promote melting of the solder metal and wetting of the bond pads with the solder when the solder is heated above a reflow temperature. If solder spheres are used, the solder spheres are typically contacted with a tacky flux composition which helps hold the solder spheres in place as they are heated to a temperature to which they will flow. This heating process, commonly referred to as "reflow," will metallurgically attach the solder to the bond pads, creating solder balls or bumps on the chip (step 16).

The solder bumps will tend to oxidize. Accordingly, a flux is usually necessary to clean the metal oxides from the solder to attach the chip to the substrate. In step 20, the solder balls are dipped in a flux. This is commonly accomplished using a rotating drum with a supply of an organic flux and a doctor knife to control the thickness of the flux. Thereafter, the chip may be placed on the substrate in step 22. The solder balls on the chip may be reflowed to attach the component to the substrate (step 24), with the flux deposited on the solder balls in step 20 promoting flow of the solder.

Older fluxes commonly left a residue that was unsightly and/or interfered with further processing of the microelectronic assembly or degraded its performance. Accordingly, such flux residues may be cleaned in step 26. Increasingly, so-called "no-clean" fluxes are being employed. Such fluxes typically leave virtually no reside at all or leave a residue which is unlikely to interfere with further processing or use of the microelectronic assembly.

When the flip chip is coupled to the substrate, a gap is commonly left between the flip chip and the opposed surface of the substrate. To further enhance the mechanical bond between the chip and the substrate, this gap may be filled in step 28 with an underfill material, typically an organic resin. This underfill material may also protect the solder joints from chemical attack by moisture or other agents. At the end of the process 10, optionally including the cleaning and underfill steps 26 and 28, a microelectronic component assembly is produced (step 40).

DETAILED DESCRIPTION

A. Overview

Figure 1:
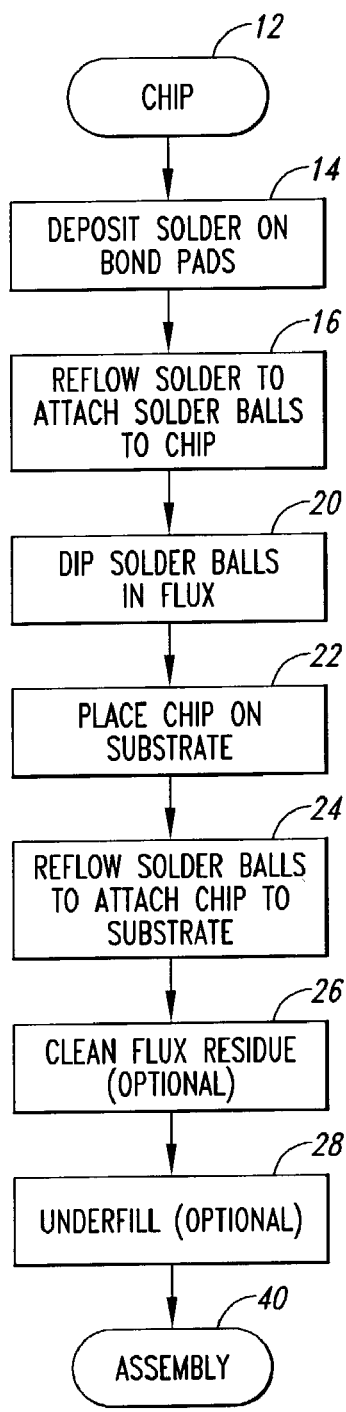
FIG. 1 is a schematic flow diagram of a conventional flip chip manufacturing process in accordance with the prior art.

Various embodiments of the present invention provide solder compositions, microelectronic components, microelectronic component assemblies, and methods employing such microelectronic components. Unless the specific context clearly requires otherwise, throughout the description and claims the terms "microelectronic component" and "microelectronic component assembly" may encompass a variety of articles of manufacture, including, e.g., semiconductor wafers having active components, individual integrated circuit dies, packaged dies, and subassemblies consisting of two or more microelectronic components, e.g., a stacked die package. The following description provides specific details of certain embodiments of the invention illustrated in the drawings to provide a thorough understanding of those embodiments. It should be recognized, however, that the present invention can be reflected in additional embodiments and the invention may be practiced without some of the details in the following description.

In one embodiment, the present invention provides a solder composition adapted to couple a microelectronic component to a substrate. This solder composition may include an electrically conductive metal and a flux composition. The flux composition includes a first fluxing agent and a second fluxing agent. The first fluxing agent has flux activity, e.g., it reacts with an oxide of the metal, at a first activation temperature and is present in an amount to promote a first melting of the metal at the first activation temperature. The second fluxing agent has a melting temperature higher than the first activation temperature and has flux activity, e.g., reacts with an oxide of the metal, at a second activation temperature that is higher than the first activation temperature. The second fluxing agent is present in an amount to promote a second melting of the metal at the second activation temperature which follows the first melting and a subsequent resolidification of the metal.

In another embodiment, the invention provides a microelectronic component including such solder. In particular, the microelectronic component includes a first surface bearing a plurality of electrical terminals. The component also includes a plurality of solder deposits, each solder deposit being positioned on a different one of the electrical terminals. The solder may have the same composition as that mentioned in the preceding paragraph.

Another embodiment of the invention provides a solder composition adapted to couple a microelectronic component to a substrate. The solder composition includes a metal alloy and a flux composition. The flux composition comprises a binder, a thixotropic rheology modifier, a first fluxing means for reacting with an oxide of the alloy to promote melting of the alloy at a first reflow temperature, and a second fluxing means for reacting with an oxide of the alloy at a higher second reflow temperature, which second melting occurs after the first melting of the alloy and a subsequent resolidification of the alloy.

Still another embodiment of the invention provides a microelectronic component which comprises a body having a first surface bearing a plurality of electrical terminals formed of a first electrically conductive material and a plurality of solder balls. Each solder ball is attached to a different one of the electrical terminals (e.g., by a ball-attach reflow) and each solder ball comprises an electrically conductive metal and a solid fluxing agent within the solder ball. The electrically conductive metal has a metal flow temperature and is a different material from the first electrically conductive material of the terminals. The solid fluxing agent has flux activity at a reflow temperature, which may be higher than the metal flow temperature. The fluxing agent is present in an amount efficacious to promote melting of the metal at the reflow temperature.

An alternative embodiment of the invention provides a microelectronic component assembly that includes a microelectronic component and a microelectronic substrate. The microelectronic component has a first confronting surface bearing a plurality of component electrical terminals formed of a first electrically conductive material. The microelectronic substrate has a second confronting surface bearing a plurality of substrate electrical terminals formed of a second electrically conductive material. The second confronting surface is opposed to the first confronting surface. A plurality of solder balls are disposed between the first and second confronting surfaces, with each solder ball being attached to a different one of the component electrical terminals and abutting, but not bonded to, one of the substrate electrical terminals. Each solder ball may comprise an electrically conductive metal that has a metal flow temperature and a solid fluxing agent within the solder ball. The electrically conductive metal of the solder balls may be different from the first electrically conductive material and from the second electrically conductive material. The solid fluxing agent has flux activity at a component attach reflow temperature, which may be higher than the metal flow temperature. The fluxing agent may be present in an amount efficacious to promote melting of the metal at the component attach reflow temperature.

Still another embodiment of the invention provides a method of processing a microelectronic component that has a first surface bearing a plurality of component electrical terminals. In accordance with this method, a plurality of solder deposits are deposited, with each solder deposit being deposited on a different one of the component electrical terminals and comprising an electrically conductive metal, a first fluxing agent, and a second fluxing agent. The solder balls are heated to a ball attach reflow temperature and the first fluxing agent reacts with an oxide of the electrically conductive metal to promote flow of the solder deposits at the ball attach reflow temperature. These solder deposits are allowed to cool to a temperature below the ball attach reflow temperature, with each cooled solder deposit defining a solder ball attached to a component electrical terminal. Each solder ball includes an amount of the second fluxing agent efficacious to promote flow of the solder at a temperature higher than the ball attach reflow temperature.

Yet another embodiment of the invention provides a method of electrically coupling a microelectronic component having component electrical terminals to a microelectronic substrate having substrate electrical terminals. This method includes depositing solder on at least some of the component electrical terminals, with the solder comprising an electrically conductive metal, a first fluxing agent, and a second fluxing agent. The solder deposits are heated to a ball attach reflow temperature and the first fluxing agent promotes flow of the solder deposits at the ball attach reflow temperature. The solder deposits are allowed to cool to a temperature below the ball attach reflow temperature, with each cooled solder deposit defining a solid solder ball attached to a component electrical terminal. Each solder ball includes an amount of the second fluxing agent. The microelectronic component and the microelectronic substrate are juxtaposed, with each of the solder balls contacting at least one of the substrate electrical terminals. The solder balls are heated to a second reflow temperature that is higher than the ball attach reflow temperature. The second flux promotes flow of the solder at the second reflow temperature to electrically couple the microelectronic component to the microelectronic substrate.

B. Solder Compositions

Some embodiments of the invention provide solder compositions that may be used to couple a microelectronic component to a substrate. The solder compositions may generally include an electrically conductive metal and a flux composition. A wide variety of electrically conductive metals may be suitable. In one embodiment, the metal is selected to form a stable metallurgical bond with the material of an electrical contact to which the solder will be attached. The metal of the solder may also be selected to be mechanically and chemically compatible with the other features of the microelectronic component.

The electrically conductive metal may comprise a single metallic element. More commonly, the electrically conductive metal will comprise an alloy. In one embodiment, the solder is an alloy comprising zinc and lead. The alloy optionally includes other elements, as well, such as silver. In one embodiment, the metal comprises a eutectic consisting essentially of about 63% tin and about 37% lead. In another embodiment, the metal alloy consists essentially of about 62% tin, about 36% lead, and about 2% silver. Lead-free solder compositions are gaining increased acceptance in the microelectronics industry. Hence, in alternative embodiments, the metal may comprise one or more of Sn—Ag—Cu alloys, Sn—Zn—Bi alloys, and Sn—Ag—Bi alloys. Any other suitable electrically conductive metal may instead be used; a wide variety of metals and metal alloys are commercially available for use as microelectronic component solders.

If the electrically conductive metal comprises a eutectic alloy, the metal may exhibit a melting point at a specific temperature. With non-eutectic compositions, the metal will commonly melt over a range of temperatures; in such metals, the solidus may be considered the melting temperature even though solid and liquid metal may coexist.

The electrically conductive metal may be present in the solder composition in a variety of forms. In one embodiment, the electrically conductive metal in the solder composition comprises a finely divided powder having a particle size of between about 10 and about 100 microns, with a range of about 20–75 microns sufficing for most applications. The metal may comprise a homogenous powder in which each particle of the powder has a substantially homogenous composition. In another embodiment, the metal particles are non-homogenous and may include a coating of a lower melting point metal surrounding a higher melting point core. Solder particles that more closely approximate a spherical shape may improve processing parameters during solder reflow.

As noted above, the solder composition also includes a flux composition. In one embodiment, the flux composition comprises a first fluxing agent, a second fluxing agent, and a flux vehicle including a binder, a solvent, and a rheology modifier. In some applications, the flux vehicle may omit one or more of these elements and, in select circumstances, the flux vehicle may be entirely omitted.

Flux vehicles are well known in the art and any of a wide variety of commercially available binders, solvents, and rheology modifiers may be employed in the flux vehicle of the present solder. The nature and relative percentages of these materials in the solder composition will vary depending on the particular application. For example, the slump properties and tackiness of a solder composition used in non-fine pitch stencil printing applications may be materially different from the requirements for a solder composition to be deposited by screen printing or using a syringe.

As flux vehicles are well known, there is no need to explain them in great detail here. Briefly, though, the binder may comprise a rosin, which is (or is derived from) a naturally occurring material found in coniferous trees, or a man-made resin. This rosin or resin may be selected to flow at a temperature that is less than the temperature at which the solder composition will begin to flow. The solvent may act as a carrier system that will be volatilized after application. The selection of the solvent will depend on the desired work life, tack time, and slump of the solder composition and will also affect the heating profile requirements. The rheology modifier will affect the flow properties of the solder composition and may also limit separation of the solder composition during long-term storage. In one embodiment, the rheology modifier is thixotropic; a number of thixotropic rheology modifiers are known in the art.

Flux compositions in accordance with embodiments of the invention employ a first fluxing agent which promotes melting of the metal in the solder composition at a first activation temperature and a second fluxing agent which promotes melting of the metal at a higher second activation temperature. Both of these fluxing agents are adapted to promote melting and flow of the metal in the solder by reacting with contaminants in the solder composition that may inhibit such melting. For example, the particles of electrically conductive metal may have a relatively high surface area, increasing the likelihood that the metal will oxidize. These metal oxides and a number of other potential contaminants are refractory materials that will make it more difficult to melt the metal particles. By reacting with the metal oxides and/or other contaminants that can interfere with efficient melting of the metal particles, the fluxing agents can promote the flow of the solder composition at a lower temperature. In one embodiment, the first and second fluxing agents both also limit reaction of the atmosphere with the molten electrically conductive metal, e.g., during a reflow operation.

One difference between the first and second fluxing agents is the temperature at which the fluxing agent significantly promotes melting of the electrically conductive metal and flow of the solder composition. The first fluxing agent may react with oxides and other contaminants at a first temperature that is at or below the melting point of the electrically conductive metal. This will help remove the oxides and other contaminants that can interfere with efficient melting of the metal so it can begin melting upon reaching its melting point. In another embodiment, the first fluxing agent exhibits fluxing properties at temperatures above the melting point of the metal. In one embodiment, the first activation temperature is no higher than about 240° C., e.g., about 150° C.–220° C. Such a fluxing agent may be appropriate for lead-tin eutectic alloys, which have a melting point of about 183° C. In lead-free solder compositions, where the melting point of the metal alloy tends to be higher, the first fluxing agent may exhibit fluxing activity only at higher temperatures.

The first fluxing agent may comprise any of a number of common fluxing agents with fluxing activity at the desired temperature. In one embodiment, the first fluxing agent is selected from a group consisting of organic acids, amines, alcohols, and epoxy resins with a cross-linking agent with fluxing properties. Suitable organic acids include, but are not limited to, carboxylic acids (—COOH). Suitable amine fluxing agents include, but are not limited to, aliphatic amines having 1–10 carbon atoms, e.g., trimethylamine, triethylamine, n-propylamine, n-butylamine, isobutylamine, sec-butylamine, t-butylamine, n-amylamine, sec-amylamine, 2-ethylbutylamine, n-heptylamine, 2-ethylhexylamine, n-octylamine, and t-octylamine. Various epoxy resins employing a cross-linking agent with fluxing properties and useful as the first fluxing agent are disclosed in U.S. Pat. No. 6,367,150, the entirety of which is incorporated herein by reference. In one embodiment, the first fluxing agent comprises a mixture of two or more fluxing agents, each of which reacts with an oxide of the electrically conductive metal at a temperature at or below the desired first activation temperature.

The first fluxing agent exhibits flux activity, e.g., it reacts with oxides of the metal in the solder composition, at a lower temperature than the second fluxing agent exhibits flux activity. Hence, the first activation temperature is lower than the second activation temperature. In one embodiment, the second activation temperature is at least about 25° C. higher than the first activation temperature. A second activation temperature of about 25–70° C. higher than the first activation temperature is expected to suffice for most applications. In one embodiment, the second activation temperature is higher than a melting temperature of the electrically conductive metal. It is anticipated that a temperature difference between the first and second activation temperatures of less than 25° C. may require unduly rigorous process controls in some applications. In one particular embodiment, the second activation temperature is at least about 200° C.; a second activation temperature of about 220–270° C. is expected to work well with most Sn—Pb-based solder compositions. As noted above, lead-free solder compositions may require higher processing temperatures.

Any of a variety of commercially available fluxing agents may be employed as the second fluxing agent. In one particular embodiment, the second fluxing agent has a melting temperature that is higher than the first activation temperature. In one embodiment, the second fluxing agent is selected from a group consisting of organic acids, amines, alcohols, and epoxy resins with a cross-linking agent with fluxing properties. In one application of this embodiment, the second fluxing agent includes at least one of an organic acid with two or more carboxylic groups, and an epoxy resin with a cross-linking agent with fluxing properties. In one more specific example, the second fluxing agent comprises an agent selected from a group consisting of aromatic dicarboxylic acids having 6–30 atoms and aliphatic dicarboxylic acids having 6–30 carbon atoms. In some embodiments, the second fluxing agent comprises a "no-clean" fluxing agent that either leaves no substantial residue or leaves a residue that is compatible with a resinous underfill material. U.S. Pat. No. 6,059,894, the entirety of which is incorporated herein by reference, suggests a variety of monocarboxylic, hydroxycarboxylic, and dicarboxylic acids which, used alone or mixed with one another, may provide a suitable second fluxing agent; some of these acids may also be useful as a first fluxing agent.

Hence, embodiments of the present invention provide solder compositions that include a metal, a lower-temperature fluxing agent, and a higher-temperature fluxing agent. By appropriately selecting the activation temperatures of the two fluxing agents, one can heat the solder to a temperature at or above both the first activation temperature and the melting temperature of the metal, yet not reach or exceed the second activation temperature. This can facilitate a first soldering operation, such as a solder reflow.

The second fluxing agent should be stable enough at the temperature of the first soldering operation that a residual quantity of the second fluxing agent will remain in the hardened solder at the end of the first solder operation. Not all of the second fluxing agent need survive the first soldering operation. In one embodiment, though, the second fluxing agent should be present in the solder after the first soldering operation in an amount efficacious to promote a second melting of the metal. If the second fluxing agent is solid in the range of temperatures encountered in the first soldering operation, for example, this second fluxing agent may be activated by heating it to a temperature at or above its melting temperature.

C. Selected Applications for Solder Composition

Figure 2:
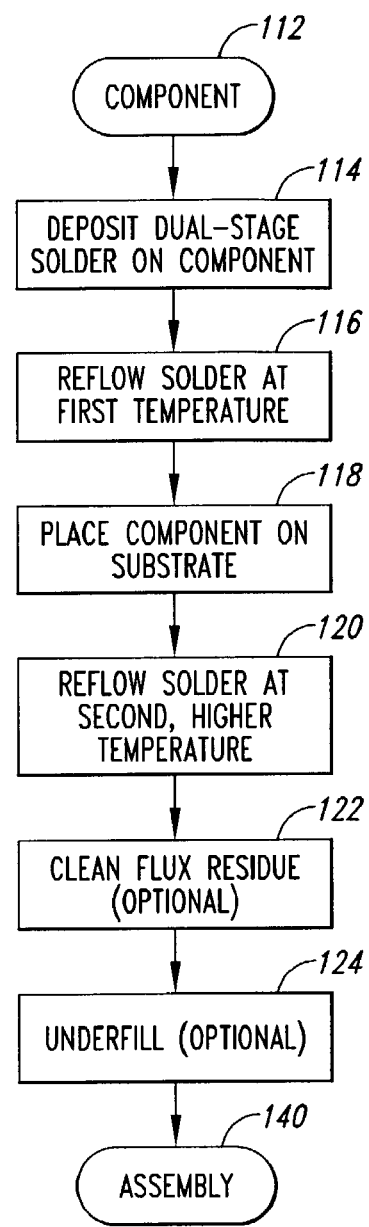
FIG. 2 is a schematic flow diagram of a method in accordance with one embodiment of the present invention.
Figure 3:
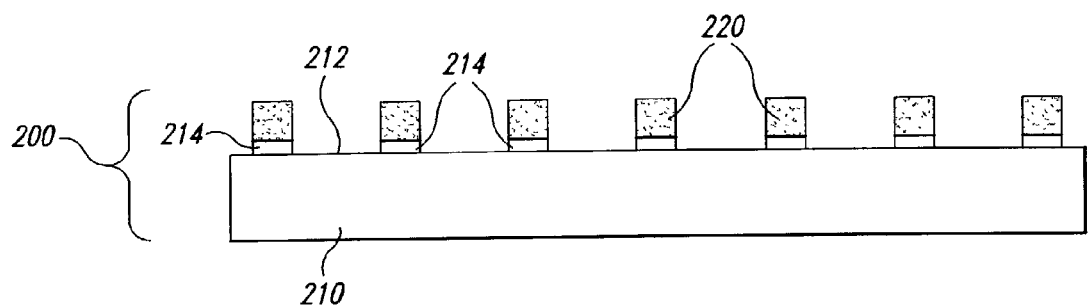
FIG. 3 schematically illustrates a microelectronic component in one stage of the process shown in FIG. 2.

Various embodiments of the solder composition described above can be used in a number of different operations. FIG. 2 schematically illustrates a method of assembling a microelectronic component assembly in accordance with one embodiment of the invention. In this method 100, a microelectronic component is provided at step 112. The microelectronic component, as noted above, can take any of a variety of forms. It may, for example, comprise a semiconductor wafer, a bare or packaged integrated circuit die or chip, or a multi-component microelectronic subassembly. One such microelectronic component 210 is shown in FIG. 3. This microelectronic component 210 has a plurality of electrical terminals 214 arrayed on a terminal surface 212. In one embodiment, a soldermask is provided on the entire terminal surface 212 except for the areas of the electrical terminals 214. Such a soldermask may limit wetting of the terminal surface 212 by the solder in a subsequent reflow operation. A variety of soldermasks are known in the art and commercially available. By way of example, one possible soldermask is disclosed in U.S. Pat. No. 6,388,199, the entirety of which is incorporated herein by reference.

In step 214 of FIG. 2, a solder comprising a two-stage flux composition such as those discussed above may be deposited on the terminals 214. As shown in FIG. 3, this solder may be delivered using a conventional stencil to place a solder deposit 220 atop each of the terminals 214. In other embodiments, the solder composition may be applied as a solid solder ball which is held on the terminals 214 using a suitable tacky material, or may be delivered via silk screening, a syringe, or any other known technique.

In step 116 of FIG. 2, the solder deposits 220 are reflowed at a first temperature. In one embodiment, this first temperature is at least as great as the melting temperature of the metal of the solder; in a more specific embodiment, this first temperature exceeds the melting temperature of the metal. At this first temperature, the first fluxing agent is able to react with an oxide of the metal of the solder composition, promoting melting and, hence, flow of the metal. This first fluxing agent may also be adapted to clean the surface of the terminals 214, e.g., by reducing any oxides thereon or helping remove a passivation layer which may be applied on the terminals 214.

Figure 4:
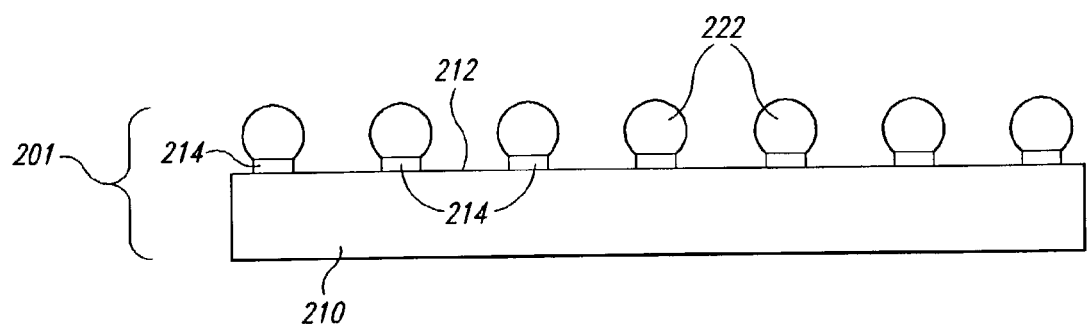
FIG. 4 schematically illustrates the microelectronic component of FIG. 3 in a later stage of the process shown in FIG. 2.

After the solder has been reflowed in step 116, it may be allowed to cool to a temperature below the melting temperature of the solder. If so desired, the solder and the microelectronic component 210 may be allowed to cool to room temperature for storage. As illustrated in FIG. 4, the solder deposits 220 of the subassembly 200 shown in FIG. 3 may form solder balls 222, with one solder ball 222 associated with each terminal 214. FIG. 4 illustrates these solder balls 222, which are also conventionally referred to as solder bumps, as idealized frustrums of spheres. It should be recognized that other shapes are possible, though. If the flux composition, including the first fluxing agent, is not a "no-clean" composition, the resultant bumped microelectronic component 201 may be washed to remove the flux residue.

The bumped microelectronic component 201 may have an appearance that resembles that of a conventional bumped flip chip. In a conventional bumped flip chip, however, relatively little or none of the fluxing agent will remain on or in the solder balls. In particular, there generally is not sufficient flux associated with the solder balls to effectively promote reflow of the solder balls in the subsequent reflow step (24 in FIG. 1). As a consequence, the solder balls will require an additional external application of flux, such as by dipping the solder balls in a supply of flux, as discussed above in connection with step 20 of FIG. 1.

In contrast, the solder balls 222 of the microelectronic component 201 shown in FIG. 4 may be thought of as "self-fluxing" solder balls. In particular, the second fluxing agent is present in the solder balls 222 in an amount efficacious to promote melting of the solder balls in a subsequent reflow operation. In one embodiment, at least a portion of the second fluxing agent is dispersed in the body of the solder ball 222, though some of the second fluxing agent may migrate to the surface of the solder balls 222 during the ball-attach reflow 116. The presence of the second fluxing agent in the solder balls 222 may obviate the need to apply additional solder, as is required with a conventional flip chip operation. Eliminating the additional handling necessary to dip the solder balls in a separate flux can increase throughput of the manufacturing operation and reduce product losses attributable to the handling operation.

Figure 5:
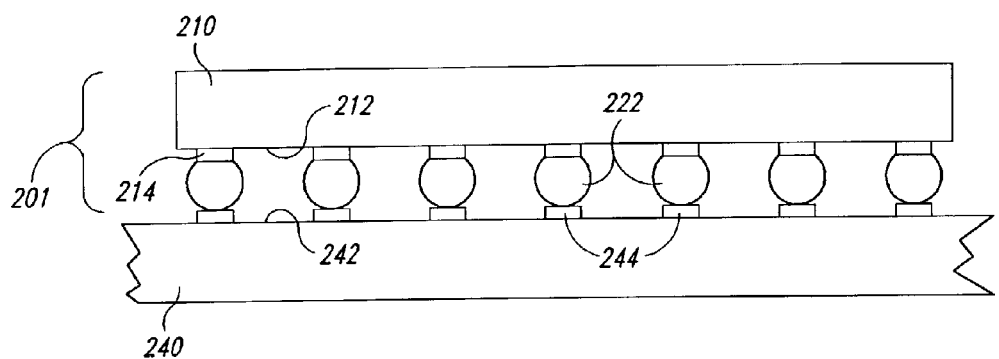
FIG. 5 is a schematic illustration of the microelectronic component of FIG. 4 incorporated in a microelectronic component assembly in a later stage of the process shown in FIG. 2.

This bumped microelectronic component 201 may be positioned with respect to a substrate in step 118 of FIG. 2. As shown in FIG. 5, the substrate 240 may include a confronting face 242 that carries an array of substrate electrical terminals 244. At least some of these terminals may be arranged in an array that mirrors the array of terminals 214 and attached solder balls 222 of the microelectronic component 201.

The substrate 240 may be rigid or flexible and have any desired configuration. The substrate 240 may be formed of material commonly used to manufacture microelectronic substrates, such as ceramic, silicon, glass, or combinations thereof. The substrate 240 can alternatively be formed of an organic material or other materials suitable for PCBs; in one embodiment, the substrate 240 comprises an FR-4 PCB. In another embodiment, the substrate 240 comprises a flexible interposer, such as a conventional polyamide tape. In other embodiments, the substrate 240 may comprise another microelectronic component and the resultant microelectronic assembly 250 (FIG. 6) may be a stacked die package used in a subsequent assembly operation.

As illustrated in FIG. 5, the solder balls 222 are positioned between the terminal surface 212 of the microelectronic component 210 and the confronting face 242 of the substrate 240. At this stage, the solder balls 222 will not be bonded to the substrate terminals 244. Each of the solder balls 222 may simply abut the terminals 244 of the substrate 240.

With solder balls 222 of the bumped microelectronic component 201 positioned in contact with or adjacent to the terminals 244 of the substrate, the solder may be heated to a second temperature to reflow the solder in step 120 (FIG. 2). In one embodiment, this second temperature is higher than the first temperature in step 116 and may exceed any temperature encountered in step 116. Hence, it is anticipated that this second temperature will exceed the melting temperature of the metal in the solder composition.

Figure 7:
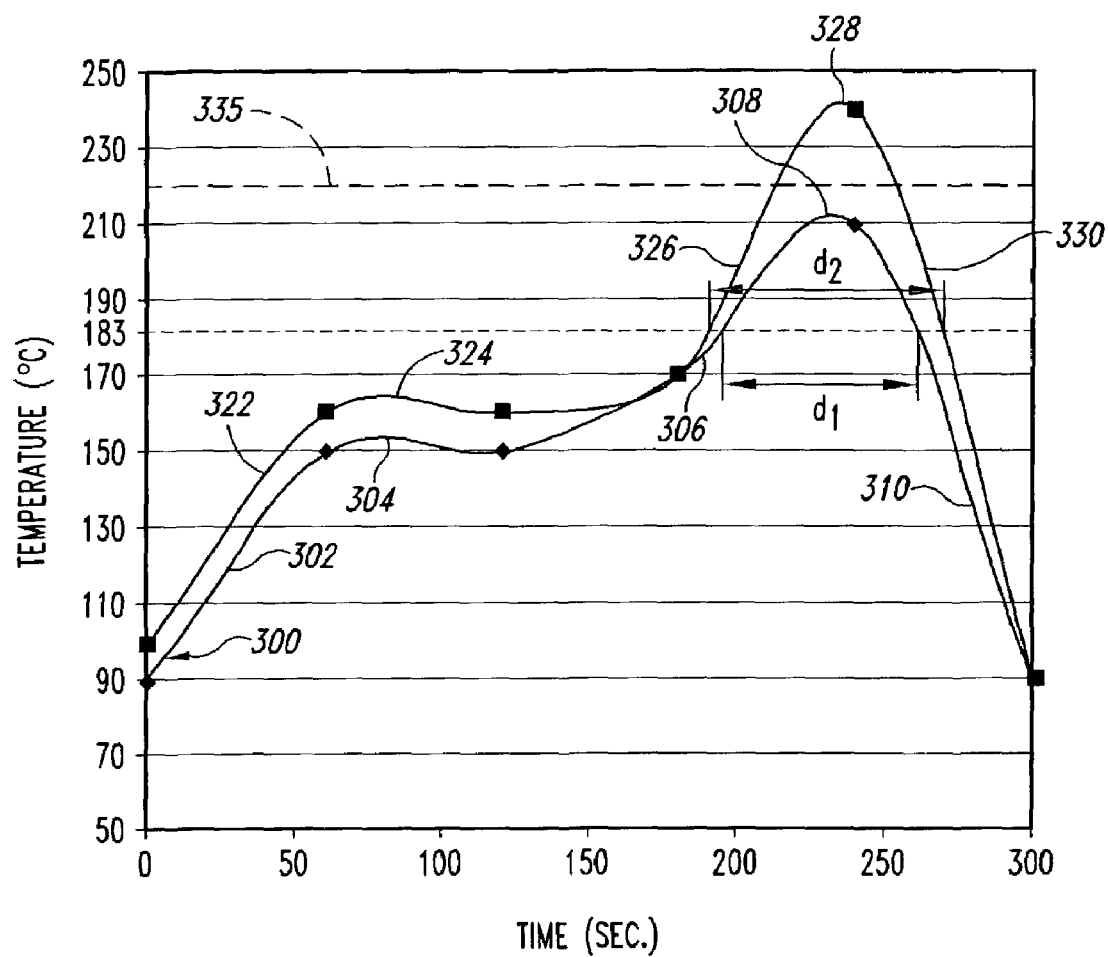
FIG. 7 graphically illustrates heating profiles that may be used in heating and in reheating a solder composition in one embodiment of the invention.

By way of example, FIG. 7 illustrates a pair of heating profiles that may be useful in one specific embodiment of the invention. In this example, the lower curve 300 is an exemplary heating profile for the first reflow operation (116 in FIG. 2) and the upper curve 320 represents an exemplary heating profile for the second reflow operation (120 in FIG. 2). Looking first at the lower curve 300, the temperature in the first reflow operation may be ramped up in the first heating phase 302 and held relatively stable in a second soak phase 304. This can help preheat the microelectronic component 210 and reduce any problems that may arise from different coefficients of thermal expansion of the materials in the microelectronic component 210. If a flux vehicle including a resin binder and a solvent are employed, this preheat 302, 304 can also help evaporate the solvent and melt or decompose the binder. After the preheat 302, 304, the temperature may be increased again in a reflow ramp 306. This reflow ramp 306 may continue to a maximum temperature 308 that meets or exceeds the first activation temperature.

In the particular example of FIG. 7, in which the solder may comprise a lead-tin eutectic alloy having a melting point of about 183° C., the maximum temperature 308 is about 212° C. This will allow a sufficient dwell time d, at or above 183° C., the melting point of the metal, to allow the solder deposits 220 (FIG. 3) to wet the terminals 214 of the microelectronic component 210 and form the solder balls 222. After the maximum temperature 308 is reached, the temperature may be decreased in a cool-down phase 310. This will cause the solder balls 222 to solidify, generally as shown in FIG. 4.

The upper curve 320 in FIG. 7 provides an exemplary heating profile for the second reflow operation 120 (FIG. 2). Much like the lower curve 300, the upper curve 320 can include a preheat operation involving a first heating phase 322 and a second soak phase 324. After this preheat operation 322, 324, the temperature may be ramped up again in a reflow ramp 326 to a maximum temperature 328. This maximum temperature 328 is greater than both the maximum temperature 308 of the first curve 300 and the melting point (183° C.) of the metal in the solder. Thereafter, the solder may be allowed to cool in a cool-down phase 330. In the illustrated embodiment, this provides a dwell time $d_2$ that is slighter longer than the dwell time $d_1$ of the lower curve 300. In another embodiment, the second dwell time $d_2$ is equal to or less than the first dwell time $d_1$.

The line 335 in FIG. 7 schematically illustrates a melting temperature of the second fluxing agent in the solder composition. This temperature 335 is greater than the maximum temperature 308 of the first curve 300. Consequently, the second fluxing agent may remain substantially solid throughout the first heating process 300. The maximum temperature 328 in the second heating process 320, however, exceeds this melting temperature 335. As a consequence, the second fluxing agent may melt, making it more reactive with the oxides or other contaminants in the solder balls 222, enabling it to more readily promote melting of the lead-tin alloy and flowing of the solder balls 222.

Figure 6:
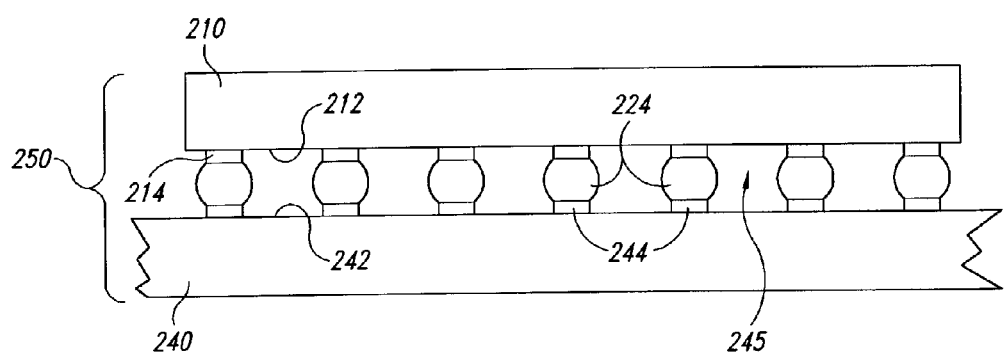
FIG. 6 schematically illustrates the microelectronic component assembly of FIG. 5 in a later stage of the process shown in FIG. 2.

As illustrated in FIG. 6, the resultant microelectronic component assembly 250 has a plurality of solder bridges 224 which are mechanically bonded to and electrically interconnect the terminals 214 of the microelectronic component 210 and the terminals 244 of the substrate 240. These bridges 224 may include a residue or reaction byproduct of the second fluxing agent and may also include a remaining unconsumed amount of the second fluxing agent. In one embodiment, though, little or none of the second fluxing agent will remain in the bridges 224.

Turning back to FIG. 2, any remaining flux residue on the bridges 224 or other components of the microelectronic component assembly 250 may be cleaned in step 122. In step 124, the gap 245 between the microelectronic component 210 and the substrate 240 may be filled with an underfill material. A wide variety of resins and epoxies are well known in the art for such underfill operations.

Hence, at the end of the process 100, a finished microelectronic component assembly 250 is provided (step 140). FIGS. 3–6 illustrate an embodiment of the method 100 of FIG. 2 in the context of a flip chip-type manufacturing operation. It should be recognized, however, that the self-fluxing solder balls 222 that result from the ball-attach reflow step 116 can be useful in a wide variety of applications. This may be helpful, for example, if the microelectronic component 210 comprises a BGA package (e.g., the BGA package illustrated in U.S. Pat. No. 6,388,199, noted above).

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. The above detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while steps are presented in a given order, alternative embodiments may perform steps in a different order. Aspects of the invention may also be useful in other applications, e.g., in soldering processes that physically join elements but do not require electrical connections. The various embodiments described herein can be combined to provide further embodiments.

In general, the terms used in the following claims should not be construed to limit the invention to the specific embodiments disclosed in the specification, unless the above detailed description explicitly defines such terms. While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

I/we claim:

1. A solder composition adapted to couple a microelectronic component to a substrate, comprising:
   an electrically conductive metal;
   a first fluxing agent reacting with an oxide of the metal at a first temperature and present in an amount to promote a first melting of the metal at the first temperature; and
   a second fluxing agent having a melting temperature higher than the first temperature and reacting with an oxide of the metal at a second temperature that is higher than the first temperature, the second fluxing agent being present in an amount to promote a second melting of the metal at the second temperature after the first melting of the metal and a subsequent resolidification of the metal.

2. The solder composition of claim 1 wherein the flux solder composition further comprises a flux vehicle including a binder, a solvent, and a rheology modifier.

3. The solder composition of claim 2 wherein the binder comprises a rosin or a resin adapted to flow at a temperature less than the first temperature.

4. The soider composition of claim 1 wherein the metal comprises an alloy of lead and tin.

5. The solder composition of claim 1 wherein the metal is substantially lead-free.

6. The solder composition of claim 1 wherein the second temperature is at least about 25° C. higher than the first temperature.

7. The solder composition of claim 1 wherein the second temperature is about 25–70° C. higher than the first temperature.

8. The solder composition of claim 1 wherein the first temperature is no higher than about 240° C.

9. The solder composition of claim 1 wherein the first temperature is about 150–220° C.

10. The solder composition of claim 1 wherein the second temperature is at least about 200° C.

11. The solder composition of claim 1 wherein the second temperature is about 220–270° C.

12. The solder composition of claim 1 wherein the first fluxing agent comprises an agent selected from a group consisting of organic acids, amines, alcohols, and epoxy resins with a cross-linking agent with fluxing properties.

13. The solder composition of claim 1 wherein the second fluxing agent includes at least one of an organic acid with two or more carboxylic groups and an epoxy resin with a cross-linking agent with fluxing properties.

14. The solder composition of claim 1 wherein the second fluxing agent comprises an agent selected from a group consisting of aromatic dicarboxylic acids having 6–30 carbon atoms and aliphatic dicarboxylic acids having 6–30 carbon atoms.

15. A solder composition adapted to couple a microelectronic component to a substrate, comprising:
    a metal alloy;
    a binder;
    a rheology modifier;
    a first fluxing means for reacting with an oxide of the alloy to promote a first melting of the alloy at a first temperature; and
    a second fluxing means for reacting with an oxide of the alloy to promote a second melting of the alloy at a higher second temperature, which second melting occurs after the first melting of the alloy and a subsequent resolidification of the alloy.

16. The solder composition of claim 15 wherein the binder comprises a rosin or a resin adapted to flow at a temperature less than the first temperature.

17. The solder composition of claim 15 wherein the second temperature is at least about 25° C. higher than the first temperature.

18. The solder composition of claim 15 wherein the second temperature is about 25–70° C. higher than the first temperature.

19. The solder composition of claim 15 wherein the first temperature is no higher than about 240° C.

20. The solder composition of claim 15 wherein the first temperature is about 150–220° C.

21. The solder composition of claim 15 wherein the second temperature is at least about 200° C.

22. The solder composition of claim 15 wherein the second temperature is about 220–270° C.

23. The solder composition of claim 15 wherein the first fluxing means comprises an agent selected from a group consisting of organic acids, amines, alcohols, and epoxy resins with a cross-linking agent with fluxing properties.

24. The solder composition of claim 15 wherein the second fluxing means includes at least one of an organic acid with two or more carboxylic groups and an epoxy resin with a cross-linking agent with fluxing properties.

25. The solder composition of claim 15 wherein the second fluxing means comprises an agent selected from a group consisting of aromatic dicarboxylic acids having 6–30 carbon atoms and aliphatic dicarboxylic acids having 6–30 carbon atoms.

* * * * *